United States Patent
Sakurai

(10) Patent No.: US 9,761,518 B2
(45) Date of Patent: Sep. 12, 2017

(54) CAVITY SUBSTRATE AND METHOD OF MANUFACTURING THE SAME

(71) Applicant: KYOCERA Circuit Solutions, Inc., Kyoto (JP)

(72) Inventor: Keizou Sakurai, Yasu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/048,250

(22) Filed: Feb. 19, 2016

(65) Prior Publication Data
US 2016/0247753 A1 Aug. 25, 2016

(30) Foreign Application Priority Data
Feb. 23, 2015 (JP) ................................. 2015-032780

(51) Int. Cl.
| | |
|---|---|
| *H01L 23/498* | (2006.01) |
| *H05K 1/02* | (2006.01) |
| *H05K 3/00* | (2006.01) |
| *H01L 21/48* | (2006.01) |
| *H01L 23/538* | (2006.01) |

(52) U.S. Cl.
CPC ...... *H01L 23/49833* (2013.01); *H01L 21/486* (2013.01); *H01L 23/49827* (2013.01); *H01L 23/5389* (2013.01); *H05K 1/0298* (2013.01); *H05K 3/0058* (2013.01)

(58) Field of Classification Search
CPC ......... H01L 23/49833; H01L 23/49838; H01L 23/49827; H01L 21/486; H05K 1/0298; H05K 3/0058
USPC .......................................... 174/255; 156/250
See application file for complete search history.

(56) References Cited

U.S. PATENT DOCUMENTS

| | | | | |
|---|---|---|---|---|
| 5,478,420 A | * | 12/1995 | Gauci | ..................... B32B 18/00 156/247 |
| 7,864,399 B2 | * | 1/2011 | McCabe | ................. G02F 1/157 359/265 |
| 2006/0172564 A1 | | 8/2006 | Nilsson et al. | |
| 2014/0182911 A1 | * | 7/2014 | Lee | ........................ H05K 1/185 174/260 |

FOREIGN PATENT DOCUMENTS

| | | |
|---|---|---|
| CN | 1802885 A | 7/2006 |
| JP | 07-142823 A | 6/1995 |
| TW | 201414389 A | 4/2014 |
| WO | 2014/051233 A2 | 4/2014 |

OTHER PUBLICATIONS

Taiwan Office Action with English concise explanation, Taiwan Patent Application No. 105105107, dated May 22, 2017, 6 pgs.

* cited by examiner

*Primary Examiner* — Timothy Thompson
*Assistant Examiner* — Charles Pizzuto
(74) *Attorney, Agent, or Firm* — Volpe and Koenig, P.C.

(57) ABSTRACT

A method of manufacturing a cavity substrate of the present invention includes respectively laminating second and third substrates on upper and lower surfaces of a first substrate having an opening and having an external dimension larger than an external dimension of each of the second and third substrates to ensure that an end portion of the first substrate protrudes a first length from the second and third substrates, and cutting the end portion of the first substrate protruding from each of the second and third substrates to a second length smaller than the first length.

6 Claims, 3 Drawing Sheets

CAVITY SUBSTRATE AND METHOD OF MANUFACTURING THE SAME

BACKGROUND OF THE INVENTION

1. Field of the Invention

The present invention relates to a cavity substrate having a plurality of substrates laminated thereon, and a method of manufacturing the cavity substrate.

2. Description of the Related Art

A cavity substrate B manufactured by a conventional manufacturing method is described with reference to FIG. 3.

The cavity substrate B includes a first substrate 30, a second substrate 31, and a third substrate 32. The first substrate 30 is in a square frame shape having an opening 33 in a middle part thereof. The second substrate 31 and the third substrate 32 are square flat plates. The first, second, and third substrates 30, 31, and 32 have the same external dimension. The external dimension indicates at least one, preferably both of longitudinal and lateral lengths of an outer periphery of each of the first, second, and third substrates 30, 31, and 32 during lamination.

In the cavity substrate B, the second substrate 31 and the third substrate 32 are respectively laminated on upper and lower surfaces of the first substrate 30. The opening 33 is closed from above and from below. A connection between the first substrate 30 and the second substrate 31 and a connection between the first substrate 30 and the third substrate 32 are established by interposing an adhesive layer S therebetween. A cavity K is formed using the opening 33 closed by the second and third substrates 31 and 32.

A conductor layer 34 is disposed on the upper and lower surfaces of each of the first, second, and third substrates 30, 31, and 32. The conductor layers 34 on the upper and lower surfaces of each of the substrates 30, 31, and 32 are connected to each other by a through conductor 34a extending into the substrates 30, 31, and 32.

A solder resist layer 35 is disposed on the upper surface of the second substrate 31 and on the lower surface of the third substrate 32. The solder resist layer 35 lying on the upper surface of the second substrate 31 has an opening 35a to expose a part of the conductor layer 34 lying on the upper surface of the second substrate 31. The conductor layer 34 being exposed from the opening 35a forms an electronic component connection pad 36. An electronic component is to be connected to the electronic component connection pad 36 with solder interposed therebetween.

The solder resist layer 35 lying on the lower surface of the third substrate 32 has an opening 35b to expose a part of the conductor layer 34 lying on the lower surface of the third substrate 32. The conductor layer 34 being exposed from the opening 35b forms an external connection pad 37. A wiring conductor of an external circuit board is to be connected to the external connection pad 37 with solder interposed therebetween. This establishes an electrical connection between the electronic component and the external circuit board.

A method of manufacturing the conventional cavity substrate B is described below with reference to FIGS. 4A to 4C. The same components as those in FIG. 3 have the same reference numerals, and their respective detailed descriptions are omitted.

A first step of the method is to prepare the first substrate 30, the second substrate 31, and the third substrate 32 as shown in FIG. 4A.

The substrate 30 has a thickness of approximately 0.1-0.4 mm. Each of the substrates 31 and 32 has a thickness of approximately 0.4-2.0 mm.

A second step of the method is to laminate the first substrate 30 on the third substrate 32 with an adhesive layer S interposed therebetween, thereby closing a lower side of the opening 33 as shown in FIG. 4B.

A third step of the method is to laminate the second substrate 31 on the first substrate 30 with the adhesive layer S interposed therebetween, thereby closing an upper side of the opening 33 as shown in FIG. 4C. A final step of the method is to form the cavity substrate B as shown in FIG. 3 by forming the through conductor 34a extending through each of the substrates 30, 31, and 32.

In recent years, electronic devices represented by portable communication devices and music players have become more downsized and sophisticated. Therefore, cavity substrates to be mounted on these electronic devices have been also needed to become downsized and sophisticated.

For example, a method of manufacturing an electronic component mounting substrate has been proposed by Japanese Unexamined Patent Publication No. H7-142823. The method includes preparing a workpiece shaped body with a plurality of substrates each having a circuit pattern and an electronic component mounting part, cutting the workpiece shaped body into individual piece substrates, and adhering a frame that is also used as a resin sealing frame for connecting between the individual piece substrates, to a surface-side surface of each of the individual piece substrates.

As the degrees of sophistication of the electronic devices increase, a large number of electronic elements, such as antenna elements and capacitors, are apt to be accommodated in a cavity. It is therefore necessary to ensure a certain degree of dimension of the cavity in order to accommodate the large number of electronic elements therein.

Hence, to achieve the downsizing of the cavity substrate, for example, it is necessary to increase an opening dimension of the opening 33 while reducing the external dimension of the first substrate 30.

However, a width of each of sides of the first substrate 30 which surround the opening 33 becomes extremely narrow with increasing the opening dimension of the opening 33. When the width of each side of the first substrate 30 becomes extremely narrow, a thickness of the first substrate 30 becomes extremely small, approximately 0.1-0.4 mm. A combination of both may cause significant strength degradation of the first substrate 30. Therefore, the first substrate 30 is susceptible to deformation and fracture in manufacturing processes of the cavity substrate.

Consequently, there remains the problem that it is difficult to efficiently manufacture the cavity substrate B.

SUMMARY OF THE INVENTION

It is an object of an embodiment of the present invention to provide a cavity substrate having a plurality of substrates laminated thereon, and a method of manufacturing the cavity substrate, which makes it possible to efficiently form the substrates while avoiding deformation and fracture of the substrates.

A cavity substrate according to an embodiment of the present invention includes a first substrate having an opening, and second and third substrates that are respectively laminated on upper and lower surfaces of the first substrate and close the opening to form a cavity. An external dimension of the first substrate is larger than an external dimension of each of the second and third substrates. An end portion of the first substrate protrudes from the second and third substrates.

A method of manufacturing a cavity substrate according to an embodiment of the present invention includes respectively laminating second and third substrates on upper and lower surfaces of a first substrate having an opening and having an external dimension larger than an external dimension of each of the second and third substrates to ensure that an end portion of the first substrate protrudes a first length from the second and third substrates, and cutting the end portion of the first substrate protruding from the second and third substrates to a second length smaller than the first length.

DESCRIPTION OF THE EMBODIMENTS

A cavity substrate A to be manufactured by a method of manufacturing a cavity substrate according to an embodiment of the present invention is described below with reference to FIG. 1.

Figure 1:
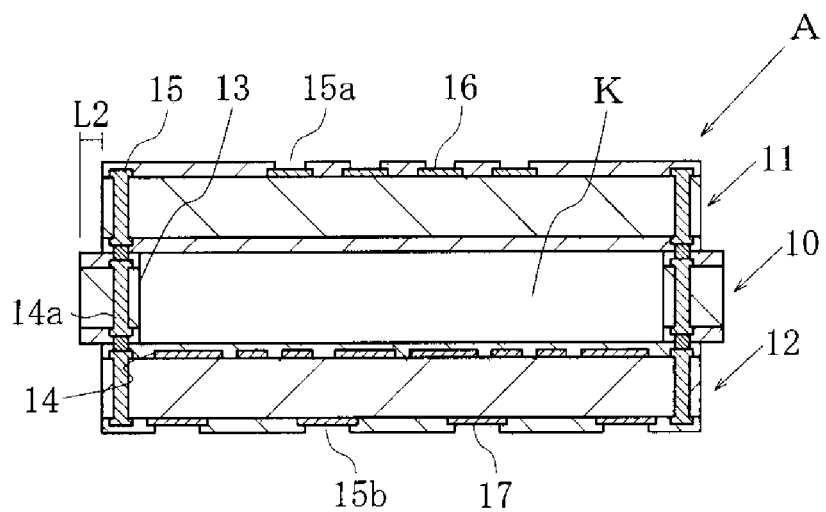
FIG. 1 is a schematic sectional view showing a cavity substrate according to an embodiment of the present invention.

The cavity substrate A includes a first substrate 10, a second substrate 11, and a third substrate 12 as shown in FIG. 1. The first substrate 10 is in a square frame shape having an opening 13. The opening 13 is preferably disposed in a middle part of the first substrate 10. The second substrate 11 and the third substrate 12 are square flat plates. An external dimension of the first substrate 10 is a second length L2 larger than an external dimension of each of the second and third substrates 11 and 12. The external dimension of each of the first, second, and third substrates 10, 11, and 12 indicates at least one, preferably both of a longitudinal length and a lateral length of an outer periphery of each of the substrates 10, 11, and 12 during lamination. The second length L2 indicates such a length that one or both of longitudinal and lateral end portions of the first substrate 10 which protrude from at least one or both of longitudinal and lateral end surfaces of each of the second and third substrates 11 and 12.

In the cavity substrate A, the second substrate 11 and the third substrate 12 are respectively laminated on upper and lower surfaces of the first substrate 10. The opening 13 is thus closed from above and from below. A cavity K is formed using the opening 13 closed by the second and third substrates 11 and 12. A conductor layer 14 is disposed on the upper and lower surfaces of each of the substrates 10, 11, and 12. The conductor layers 14 on the upper and lower surfaces of each of the substrates 10, 11, and 12 are connected to each other by a through conductor 14a formed inside the substrates 10, 11, and 12. Unlike the conventional cavity substrate B, the through conductor 14a is formed before laminating the substrates 10, 11, and 12, whose individual thicknesses are small. Therefore, even when a through hole diameter is small, it is easy to load the through conductor 14a, and a small diameter of the through conductor 14a is attainable.

A solder resist layer 15 is disposed on the upper surface of the second substrate 11 and on the lower surface of the third substrate 12. The solder resist layer 15 lying on the upper surface of the second substrate 11 has an opening 15a to expose a part of the conductor layer 14 lying on the upper surface of the second substrate 11. The conductor layer 14 being exposed from the opening 15a forms an electronic component connection pad 16. An electronic component is to be connected to the electronic component connection pad 16 with solder interposed therebetween.

The solder resist layer 15 lying on the lower surface of the third substrate 12 has an opening 15b to expose apart of the conductor layer 14 lying on the lower surface of the third substrate 12. The conductor layer 14 being exposed from the opening 15b forms an external connection pad 17. A wiring conductor of an external circuit board is to be connected to the external connection pad 17 with solder interposed therebetween. This establishes an electrical connection between the electronic component and the external circuit board.

A method of manufacturing a cavity substrate according to an embodiment of the present invention is described below with reference to FIGS. 2A to 2D. The same components as the cavity substrate A described with reference to FIG. 1 have the same reference numerals, and their respective detailed descriptions are omitted.

Figure 2A:
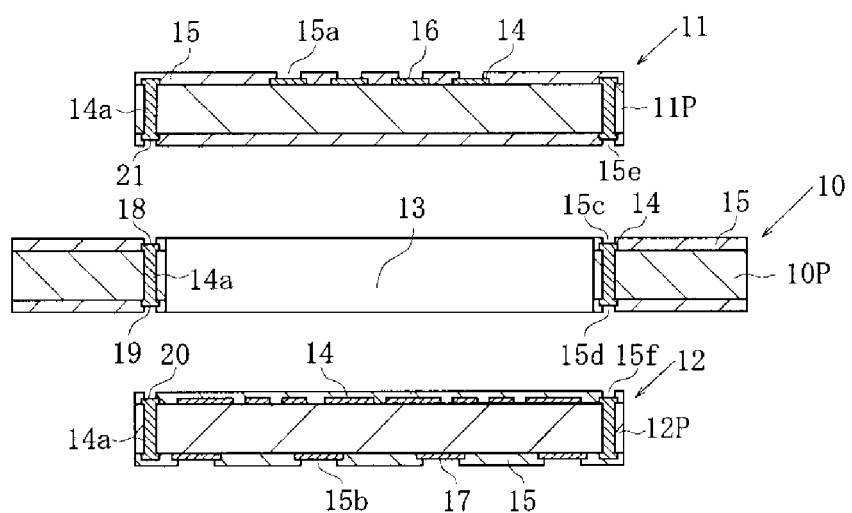
FIGS. 2A to 2D are schematic sectional views for describing processes in a method of manufacturing a cavity substrate according to an embodiment of the present invention.

A first step of the method is to prepare the first substrate 10, the second substrate 11, and the third substrate 12 as shown in FIG. 2A.

The first substrate 10 includes an insulating plate 10P, the conductor layer 14, and the solder resist layer 15. The insulating plate 10P is in a square frame shape having an opening 13 in a middle part thereof.

The conductor layer 14 is disposed on upper and lower surfaces of the insulating plate 10P around the opening 13. The conductor layers 14 on the upper and lower surfaces of the insulating plate 10P are electrically connected to each other by the through conductor 14a.

The solder resist layer 15 is adhered to the upper and lower surfaces of the insulating plate 10P. The solder resist layer 15 on the upper surface of the insulating plate 10P has an opening 15c. The solder resist layer 15 on the lower surface of the insulating plate 10P has an opening 15d. A part of the conductor layer 14 is exposed into the openings 15c and 15d. The conductor layer 14 being exposed into the opening 15c functions as an overlying substrate connection pad 18. The conductor layer 14 being exposed into the opening 15d functions as an underlying substrate connection pad 19. The first substrate 10 has a thickness of approximately 0.1-0.4 mm.

The second substrate 11 includes an insulating plate 11P, the conductor layer 14, and the solder resist layer 15. The insulating plate 11P has a square flat plate shape larger than the opening 13.

The conductor layer 14 is disposed on upper and lower surfaces of the insulating plate 11P. The conductor layers 14 on the upper and lower surfaces of the insulating plate 11P are electrically connected to each other by the through conductor 14a.

The solder resist layer 15 is adhered to the upper and lower surfaces of the insulating plate 11P. The solder resist layer 15 on the upper surface of the insulating plate 11P has an opening 15a. The solder resist layer 15 on the lower surface of the insulating plate 11P has an opening 15e. A part of the conductor layer 14 is exposed into the openings 15a and 15e. The conductor layer 14 being exposed into the opening 15a functions as an electronic component connection pad 16. The conductor layer 14 being exposed into the opening 15e functions as a second substrate connection pad 21. The second substrate 11 has a thickness of approximately 0.4-1.5 mm.

The third substrate 12 includes an insulating plate 12P, the conductor layer 14, and the solder resist layer 15. The insulating plate 12P has a square flat plate shape larger than the opening 13.

The conductor layer 14 is disposed on upper and lower surfaces of the insulating plate 12P. The conductor layers 14 on the upper and lower surfaces of the insulating plate 12P are electrically connected to each other by the through conductor 14a.

The solder resist layer 15 is adhered to the upper and lower surfaces of the insulating plate 12P. The solder resist layer 15 on the upper surface of the insulating plate 12P has an opening 15f. The solder resist layer 15 on the lower surface of the insulating plate 12P has an opening 15b. A part of the conductor layer 14 is exposed into the openings 15b and 15f. The conductor layer 14 being exposed into the opening 15f functions as a third substrate connection pad 20. The conductor layer 14 being exposed into the opening 15b functions as an external connection pad 17. The third substrate 12 has a thickness of approximately 0.4-2.0 mm.

Figure 2B:
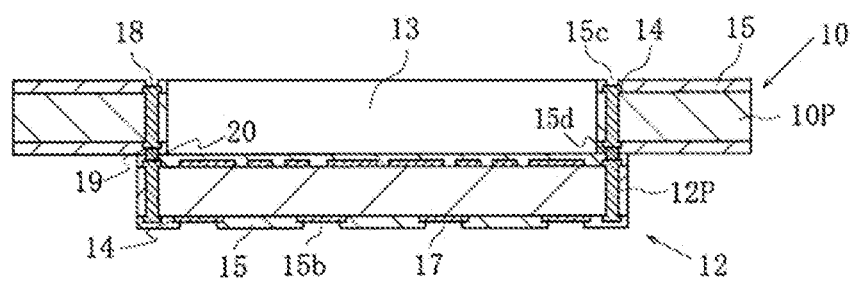

A second step of the method is to connect the third substrate 12 to the lower surface of the first substrate 10, thereby closing a lower side of the opening 13 as shown in FIG. 2B. The connection between the first substrate 10 and the third substrate 12 is established by connecting the substrate connection pad 19 and the third substrate connection pad 20 to each other with solder interposed therebetween.

Figure 2C:
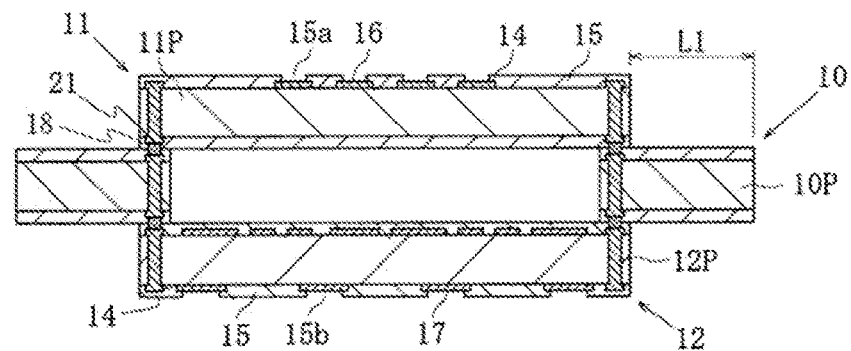

A third step of the method is to connect the second substrate 11 to the upper surface of the first substrate 10, thereby closing an upper side of the opening 13 as shown in FIG. 2C. The connection between the first substrate 10 and the second substrate 11 is established by connecting the substrate connection pad 18 and the second substrate connection pad 21 to each other with solder interposed therebetween.

On this occasion, the connection is carried out to ensure that the external dimension of the first substrate 10 protrudes a first length L1 from the external dimension of each of the second and third substrates 11 and 12. As described above, the external dimension indicates at least one, preferably both of the longitudinal and lateral lengths in the outer periphery of each of the substrates 10, 11, and 12 during the lamination. The first length L1 is such a length that at least one or both of the longitudinal and lateral end portions of the first substrate 10 protrude from at least one or both of the longitudinal and lateral end surfaces of each of the second and third substrates 11 and 12.

Figure 2D:
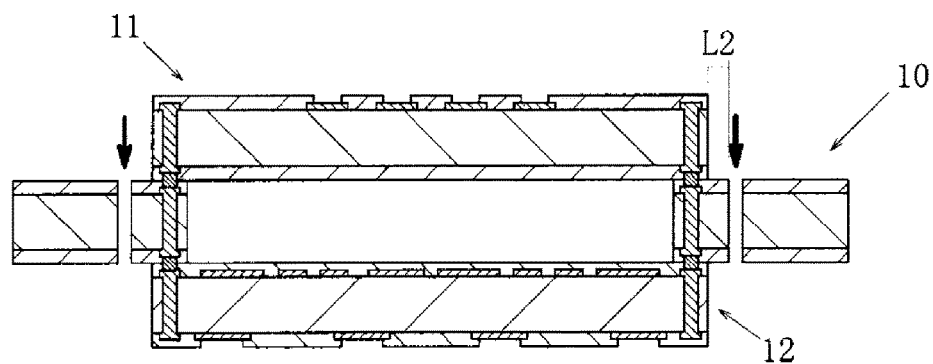
Figure 3:
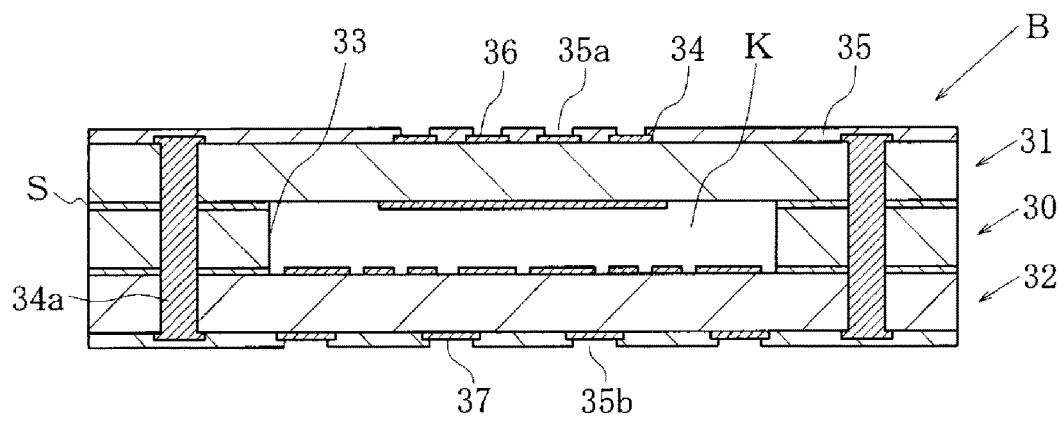
FIG. 3 is a schematic sectional view showing a cavity substrate manufactured by a conventional manufacturing method thereof.
Figure 4A:
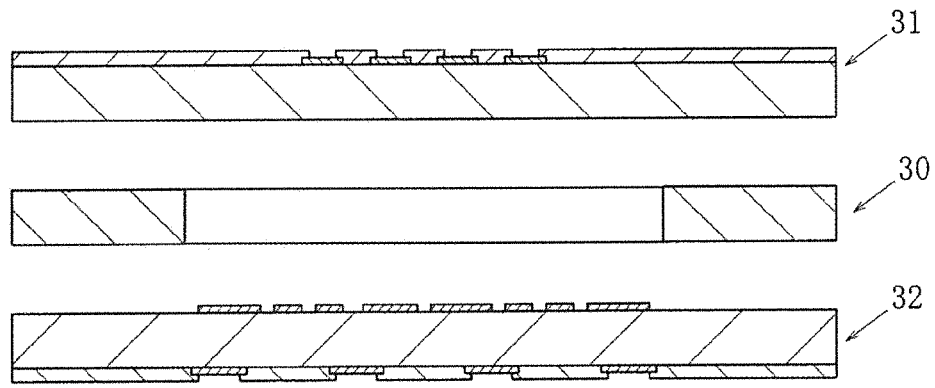
FIGS. 4A to 4C are schematic sectional views for describing processes in a method of manufacturing the conventional cavity substrate.
Figure 4B:
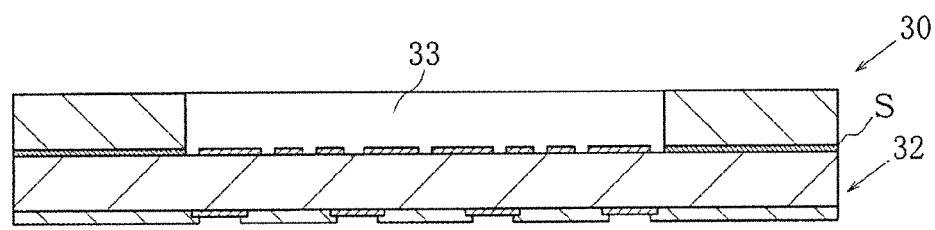
Figure 4C:
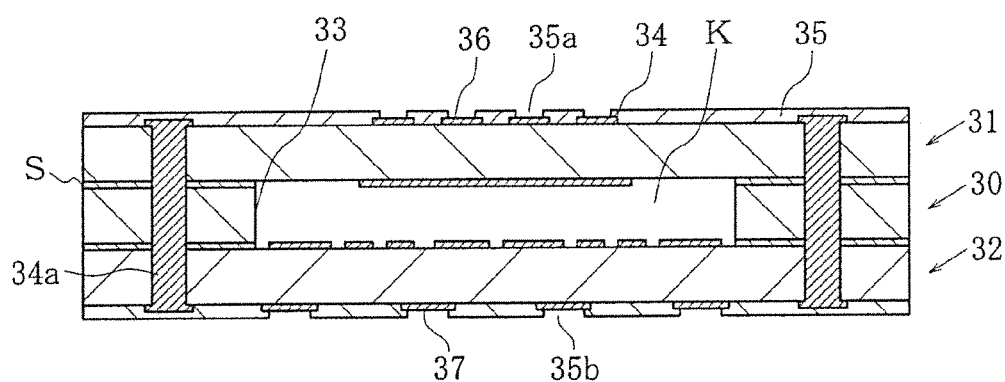

A final step of the method is to cut outer peripheral parts of the first substrate 10, which respectively protrude from the second and third substrates 11 and 12, in the vicinity of an end surface of each of the second and third substrates 11 and 12 as shown in FIG. 2D. This results in the cavity substrate A as shown in FIG. 1. A length of an end portion of the outer peripheral part of the first substrate 10 protruding from the end surface of each of the second and third substrates 11 and 12 is the second length L2. An outer peripheral part of the first substrate 10 whose protrusion exceeds the second length L2 needs to be cut by, for example, dicing process. The outer peripheral part of the first substrate 10 protruding from the end surface of each of the second and third substrates 11 and 12, which corresponds to the first length L1 and the second length L2 is at least one, preferably both of the longitudinal and lateral lengths in the outer periphery of the first substrate 10.

The second length L2 preferably falls within a range of approximately 0.3-1.0 mm from the end surface of each of the second and third substrates 11 and 12. When the second length L2 is less than 0.3 mm, a blade for the dicing process may come into contact with the second and third substrates 11 and 12 during the dicing process, thereby causing damage to the second and third substrates 11 and 12. When the second length L2 exceeds 1.0 mm, it is difficult to downsize the cavity substrate A.

With the method of manufacturing the cavity substrate of the present embodiment as described above, the external dimension of the first substrate is kept larger than the external dimension of each of the second and third substrates 11 and 12. The second and third substrates 11 and 12 are then respectively laminated on the upper and lower surfaces of the first substrate 10 so that the outer peripheral part (end portion) of the first substrate 10 protrudes the first length L1 from the end surface of each of the second and third substrates 11 and 12. Finally, the outer peripheral part (end portion) of the first substrate 10 protruding from the end surface of each of the second substrate 11 and the third substrate 12 is cut to the second length L2 smaller than the first length L1.

Until the second and third substrates 11 and 12 are laminated on the first substrate 10 having the opening 13, it is possible to ensure a large circumferential length of the opening 13 of the first substrate 10. This contributes to reducing strength degradation.

This makes it possible to efficiently form the high reliable cavity substrate A while avoiding fracture of the first substrate 10 during the manufacturing of the cavity substrate A.

Alternatively, the first substrate 10 and the second substrate 11 (or the third substrate 12) may be alternately laminated into a multilayer structure of the cavity substrate, and a plurality of cavities K may be formed therein.

The present invention is not limited to the foregoing embodiments, and various changes and modifications may be made within the scope of the present invention.

What is claimed is:

1. A cavity substrate comprising:
a first substrate having an opening; and
second and third substrates that are respectively laminated on upper and lower surfaces of the first substrate and close the opening to form a cavity,
wherein an external dimension of the first substrate is larger than an external dimension of each of the second and third substrates, and an end portion of the first substrate protrudes from the second and third substrates.

2. The cavity substrate according to claim 1,
wherein conductor layers are respectively disposed on upper and lower surfaces of each of the first, second, and third substrates, and
wherein a through conductor to connect the conductor layers is disposed inside the first, second, and third substrates.

3. The cavity substrate according to claim 1, wherein the first substrate protrudes a length of 0.3-1.0 mm from an end surface of each of the second and third substrates.

4. A method of manufacturing a cavity substrate, comprising:
laminating second and third substrates on upper and lower surfaces of a first substrate having an opening and having an external dimension larger than an external dimension of each of the second and third substrates to ensure that an end portion of the first substrate protrudes a first length from the second and third substrates; and cutting the end portion of the first substrate protruding from the second and third substrates to a second length smaller than the first length.

5. The method of manufacturing the cavity substrate according to claim 4, wherein the second length falls within a range of 0.3-1.0 mm from an end surface of each of the second and third substrates.

6. The method of manufacturing the cavity substrate according to claim 4, wherein conductor layers are respectively disposed on upper and lower surfaces of each of the first, second, and third substrates, and wherein a through conductor to connect each of the conductor layers is disposed in the first, second, and third substrates.

* * * * *